(12) United States Patent
Donaldson et al.

(10) Patent No.: US 9,176,192 B2
(45) Date of Patent: Nov. 3, 2015

(54) IDENTIFYING THE OPERATION OF A SPECIFIED TYPE OF APPLIANCE

(75) Inventors: James Donaldson, Oxford (GB); Sarah Surrall, Oxford (GB); Alexander Matthews, Oxford (GB); Malcolm McCulloch, Oxford (GB)

(73) Assignee: INTELLIGENT SUSTAINABLE ENERGY LIMITED, Oxford (GB)

( * ) Notice: Subject to any disclaimer, the term of this patent is extended or adjusted under 35 U.S.C. 154(b) by 520 days.

(21) Appl. No.: 13/387,470

(22) PCT Filed: Jul. 21, 2010

(86) PCT No.: PCT/GB2010/001383
§ 371 (c)(1),
(2), (4) Date: Jan. 27, 2012

(87) PCT Pub. No.: WO2011/012840
PCT Pub. Date: Feb. 3, 2011

(65) Prior Publication Data
US 2012/0136593 A1    May 31, 2012

(30) Foreign Application Priority Data

Jul. 30, 2009  (GB) .................................. 0913312.5

(51) Int. Cl.
*G06F 1/26* (2006.01)
*G05B 15/02* (2006.01)
(Continued)

(52) U.S. Cl.
CPC .............. *G01R 31/343* (2013.01); *G01D 4/002* (2013.01); *Y02B 90/241* (2013.01); *Y04S 20/32* (2013.01); *Y04S 20/38* (2013.01)

(58) Field of Classification Search
USPC ........... 702/60, 57, 61, 64–67, 69, 72–73, 81, 702/84, 108, 117, 127, 150–151, 157–158, 702/167, 182–183, 188–191, 193, 196, 702/199; 318/798–799; 324/76.11–76.13, 324/76.77, 86; 340/635, 648, 657–658, 340/660–661, 664; 703/2, 4, 18
See application file for complete search history.

(56) References Cited

U.S. PATENT DOCUMENTS 4,858,141 A * 8/1989 Hart et al. ....................... 702/61
5,483,153 A * 1/1996 Leeb et al. .................. 324/76.12
(Continued)

FOREIGN PATENT DOCUMENTS

EP          0698795        2/1996
EP          2000780        12/2008
(Continued)

OTHER PUBLICATIONS

EP2000780 English Version, Dec. 10, 2008, 33 pp.*
(Continued)

*Primary Examiner* — Toan Le
(74) *Attorney, Agent, or Firm* — Antonio Papageorgiou, Esq.; Meister Seelig & Fein LLP

(57) ABSTRACT

A method of identifying the operation of an electrical appliance comprising an induction motor is described. The method comprises identifying the operation of an electrical appliance including an induction motor when a path traced by real power values against corresponding reactive power values over a time period of interest comprises one or more substantially circular arcs. The real power values are related to the total real power supplied to one or more electrical appliances as a function of time, and the reactive power values are related to the total reactive power supplied to the one or more electrical appliances as a function of time. There is also described a related method of identifying the operation of a specified type of appliance, in which the operation of said specified type of appliance is dependent on a supply of at least one utility such as electricity, natural gas or water.

19 Claims, 7 Drawing Sheets

(51) Int. Cl.
*G01R 31/34* (2006.01)
*G01D 4/00* (2006.01)

(56) References Cited

U.S. PATENT DOCUMENTS 5,521,482 A * 5/1996 Lang et al. .................. 318/800
2004/0260488 A1 12/2004 Al-Hamrani

FOREIGN PATENT DOCUMENTS

| GB | 2319345 | 5/1998 | |
|----|---------|--------|---|
| WO | 9215889 | 9/1992 | |
| WO | WO 9215889 A1 | * | 9/1992 |
| WO | 2009103998 | 8/2009 | |
| WO | WO 2009103998 A2 | * | 8/2009 |
| WO | 2010007369 | 1/2010 | |
| WO | WO 2010007369 A2 | * | 1/2010 |

OTHER PUBLICATIONS

Mingguo Hong et al., "Complete controllability of an n-bus dynamic power system model". IEEE Transactions on Circuits and Systems Part 1: vol. 46, No. 6, Jun. 1, 1999, ISSN 1057-7122.

* cited by examiner

US 9,176,192 B2

IDENTIFYING THE OPERATION OF A SPECIFIED TYPE OF APPLIANCE

CLAIM OF PRIORITY

This application is a National Stage application and claims priority to PCT Application No: PCT/GB2010/001383, filed on Jul. 21, 2010, which claims priority to UK Application No. 0913312.5, filed on Jul. 30, 3009, the disclosures which are hereby incorporated by reference herein in their entirety.

FIELD OF THE INVENTION

The present invention relates to a method and apparatus for identifying the operation of a specified type of appliance, in which the operation of that specified type of appliance is dependent on a supply of at least one utility (e.g. electricity, natural gas or water). One embodiment of the present invention relates to a method and apparatus for identifying the operation of an electrical appliance comprising an induction motor.

BACKGROUND OF THE INVENTION

There is an increasing concern to reduce the consumption of resources, both at a domestic level in residential buildings, and at a commercial level in offices, shops, factories and so forth. The reasons for this are both to save costs and also because of concerns for the environment, such as to reduce $CO_2$ emissions, and to conserve finite resources such as coal, gas and oil.

Conventionally, consumers receive bills from utility companies which may indicate the quantity of the utility used since the last bill, for example monthly or quarterly, based on periodic meter readings or even based on estimates of consumption since the last meter reading. For example, in the case of electricity supply, the information is presented to the consumer in terms of the number of kilowatt hours of electrical energy that has been used, which is meaningless to many people, and gives very little idea about how they are actually using the energy and where they can cut back. Studies have shown that the effect of providing consumers with real-time detailed information about the energy they are using is that their consumption reduces by up to 20%. In order to provide this information, it is necessary to identify where the energy drawn from this supply is ending up, i.e. which appliances are being used, how much and when. It is a problem to provide this information.

Devices are known which can be plugged into a conventional electricity outlet socket which can monitor the energy consumption by a particular appliance plugged into that socket. However, this information is inconvenient to obtain, and for fully monitoring the consumption at a particular site, such as a house, a separate metering device would have to be plugged into every socket to monitor every appliance, and it is generally not possible to connect such metering devices to permanently-wired appliances, such as cookers, which are typically some of the largest consumers of energy.

As an alternative to attaching a metering device to each appliance, Non-Intrusive Load Monitors (NILMs) have been developed. Many NILM implementations work by tracking the steady state power drawn by the load and measuring significant changes which correspond to appliances turning on and off. For example, following the turn on of a 100 W incandescent light, one would observe a change in power of around 100 W. A NILM would register this change and search through its database to see whether this appliance 'signature' matched those of a previously observed appliance. If so, then it would infer that the appliance had turned on. If not, then it would infer that a previously unknown appliance had turned on for the first time. An overview of NILM technology is found in U.S. Pat. No. 4,858,141 (Hart et al.).

The approach of measuring steady state powers generally works well, but it does have problems associated with it. Such problems include (1) certain appliances do not have a repeatable steady state power (e.g. the power consumed by a motor varies with the loading on that motor); (2) some appliances do not settle to a steady state power (e.g. the constant movement of the clothes inside a tumble dryer cause a time varying load on the motor and thus an oscillating power consumption); and (3) it is hard to differentiate between different load types (e.g. a motor and a fluorescent light) using only the steady state information.

In an attempt to overcome this third problem, U.S. Pat. No. 5,483,153 (Leeb and Kirtley) make use of additional information contained in the transient signature of the load. Thus, U.S. Pat. No. 5,483,153 discloses a 'transient event detector' which detects significant variations (so-called 'v-sections') in the power supply and attempts to match the shape of the observed v-section with previously observed v-sections by using transversal filters. Induction motors may be distinguished from fluorescent lamps in this way. Additionally, U.S. Pat. No. 5,483,153 identifies that certain load types (e.g. induction motors) have similarly shaped v-sections and thus builds into the system an ability to scale the reference v-section in both time and amplitude to attempt to match a load to a previously unidentified load. However, the method of U.S. Pat. No. 5,483,153 requires that the transient turn-on profiles are repeatable, whereas the torque of an induction motor is not constant with speed and so a non linear stretching in time of the transient can occur for the same motor with different loads. Furthermore, the v-section solution of U.S. Pat. No. 5,483,153 does not deal with problems (1) and (2) identified above.

The present invention aims to alleviate, at least partially, one or more of the above problems.

SUMMARY OF THE INVENTION

An 'induction motor' is a class of motor which is found in numerous household appliances including tumble dryers and fridge pumps. By considering the equivalent circuit of a standard induction motor, it can be shown that a plot of the real power drawn by the motor against the reactive power transcribes a circular arc as the motor increases in speed (the so called 'circle diagram'). Most single phase induction motors in the home are so-called 'capacitor start' motors which have a capacitor in series with one of the motor windings. In this case, the real and reactive powers still transcribe a circular arc, although the start and finish points are different. In both cases, the parameters of the circle are dependent on the specific electrical characteristics of the motor. The point where the motor starts on the circle diagram is constant (assuming a constant voltage supply). As the motor speeds up, it travels around the circle to a point which is dependent on the load; thus if the load is constant, then the power consumption will reach a steady state; if the load is not constant, then the power will vary and any variations in power will be such that the total real and relative power consumptions remain on locus of the circle.

Therefore, following a change in total power consumption of a plurality of appliances (e.g. due to one of the appliances being switched on), it is possible to look at whether the real and reactive powers transcribe a circular arc. If they do, then the appliance in operation may be identified as an induction motor like appliance. Having identified the arc/circle, parameters of the arc/circle can be used as an appliance signature which is independent of the load.

Therefore, according to a first aspect of the present invention, there is provided a method of identifying the operation of an electrical appliance comprising an induction motor. The method comprises identifying the operation of an electrical appliance comprising an induction motor when a path traced by real power values against corresponding reactive power values over a time period of interest comprises one or more substantially circular arcs. The real power values are related to the total real power supplied to one or more electrical appliances as a function of time, and the corresponding reactive power values are related to the total reactive power supplied to the one or more electrical appliances as a function of time.

Using the method, it is possible to accurately identify whether observed power transients are due to a change in power consumption of an induction motor, and if so, it allows a robust method of identifying which motor has changed its power consumption, thus allowing the load monitor to correctly attribute the change in energy to the correct appliance. As mentioned above, the method provides a load invariant appliance signature, which is a key benefit of this technique.

In a preferred embodiment, the real power values are equal to the total real power supplied to the one or more electrical appliances as a function of time, and the corresponding reactive power values are equal to the total reactive power supplied to the one or more electrical appliances as a function of time. In an alternative embodiment, the real and reactive power values are functions of the total real and reactive powers supplied to the one or more electrical appliances as a function of time (e.g. linear multiples).

Advantageously, the real power values and the corresponding reactive power values are determined from measurements of the total current and the total voltage supplied to the one or more electrical appliances as a function of time.

Advantageously, the method further comprises a step of identifying the time period of interest. In one embodiment, the step of identifying the time period of interest comprises: detecting a time at which an electrical appliance is switched on from an increase in the total power being supplied to the one or more electrical appliances as a function of time; detecting a time at which the electrical appliance reaches a steady state power consumption; and identifying the time period of interest as being a time period between the detected switch-on time and the detected steady-state time. In another embodiment, the step of identifying the time period of interest comprises identifying a time period during which the total power supplied to the one or more electrical appliances varies as a function of time.

Advantageously, the method comprises fitting the path traced by the real power values against the corresponding reactive power values to a single circle.

In one embodiment, the method further comprises identifying the operation of an electrical appliance comprising an induction motor when an angular range of the real and reactive power values around the fitted single circle is greater than a predetermined threshold. This prevents the accidental identification of an induction motor type appliance when the appliance is actually a purely resistive device, since the path will be a substantially straight line for a resistive device, and this may be fitted well to a very large circle. More advantageously, one or more outliers in the real and reactive power values are disregarded when calculating the angular range of the real and reactive power values. This makes it less likely that a rapid power change device, such as an incandescent light bulb, will be wrongly identified as an electrical appliance comprising an induction motor.

Advantageously, the method further comprises identifying the operation of an electrical appliance comprising an induction motor when the reactive power at the centre of the fitted single circle is greater than one or more of the reactive power values. This ensures that the fitted circle has a location relative to the observed values that would be expected for an electrical appliance comprising an induction motor. Again, this reduces the number of wrongly identified induction motor type appliances.

In one embodiment, the method further comprises: identifying one or more outlying data points on the path traced by the real power values against the corresponding reactive power values; and moving the identified outlying data points so that they are located on the fitted single circle. This methodology may be used to account for 'notches' which are present in the path traced by the real and reactive power values just after start-up for some induction-motor driven appliances. A 'notch' is a set of data points which do not fit as well to a single circle as the remainder of the data set.

Advantageously, the method further comprises calculating a single-circle fit parameter representative of a goodness of the fit of the single circle to the path traced by the real power values against the corresponding reactive power values. More advantageously, the method further comprises identifying the operation of an electrical appliance comprising an induction motor by comparing the single-circle fit parameter to a predetermined threshold value. This is one particular way of determining whether a set of data points are substantially circular or not.

Advantageously, the method comprises identifying whether the path traced by the real power values against the corresponding reactive power values comprises two consecutive substantially circular arcs. The fitting of two arcs enables the first arc to be fitted to a 'notch' in the data, and the second arc to be fitted to the later data points. More advantageously, the method further comprises: partitioning the time period of interest into consecutive first and second time periods; fitting the path traced by the real power values against the corresponding reactive power values over the first time period to a first circle; and fitting the path traced by the real power values against the corresponding reactive power values over the second time period to a second circle. Even more advantageously, the method further comprises calculating a double-circle fit parameter representative of a goodness of the combined fit of the first and second circles to the path traced by the real power values against the corresponding reactive power values.

In one embodiment, the method further comprises: re-partitioning the time period into different consecutive first and second time periods; re-fitting the first and second circles in accordance with the re-partitioning; re-calculating the double-circle fit parameter in accordance with the re-partitioning; and selecting the best double-circle fit based on the calculated double-circle fit parameters. Thus, this is one method of choosing how to partition the data into the two consecutive time periods.

In an alternative embodiment, the method further comprises: fitting the path traced by the real power values against the corresponding reactive power values to a single circle; and identifying one or more outlying data points in a first portion of the path traced by the real power values against the corresponding reactive power values. Then, the first time period in the partitioning step corresponds to said first portion of the path which includes the identified outlying data points. Thus, in this case, a 'notch' in the data is first identified (by looking for deviations from a single circle), and then the location of this notch is used to partition the data into the two consecutive time periods.

In one embodiment, the method further comprises identifying the operation of an electrical appliance comprising an induction motor by comparing the double-circle fit parameter to a predetermined threshold value. In another embodiment, the method further comprises identifying the operation of an electrical appliance comprising an induction motor by comparing the single-circle fit parameter, the double-circle fit parameter and a predetermined threshold value.

Advantageously, having identified the operation of an electrical appliance comprising an induction motor, the method further comprises identifying the electrical appliance in operation based at least partially on the real power values and the corresponding reactive power values. More advantageously, the step of identifying the electrical appliance comprises comparing the real power values and the corresponding reactive power values of the electrical appliance to real power values and corresponding reactive power values in a database of known electrical appliances. For example, the step of identifying the electrical appliance may comprises: determining one or more parameters of the one or more substantially circular arcs; and identifying the electrical appliance based at least partially on the one or more arc parameters. The one or more arc parameters may include one or more of arc radius, arc length, and arc location. Advantageously, the step of identifying the electrical appliance comprises comparing the one or more arc parameters of the electrical appliance to corresponding arc parameters in a database of known electrical appliances. In one preferred embodiment, the step of identifying the electrical appliance comprises: calculating the value of $$C(\alpha, \beta) = \frac{f(\{a\}_\beta, \rho_\alpha)f(\{a\}_\alpha, \rho_\beta)}{f(\{a\}_\beta, \rho_\beta)f(\{a\}_\alpha, \rho_\alpha)};$$

and comparing the value of C to a predetermined threshold value. $\{a\}_\alpha$ denotes the real power values and the corresponding reactive power values for the electrical appliance $\alpha$. $\rho_\alpha$ denotes the one or more arc parameters for the electrical appliance $\alpha$. $\{a\}_\beta$ denotes the real power values and the corresponding reactive power values for a known electrical appliance $\beta$ in the database of known electrical appliances. $\rho_\beta$ denotes the one or more arc parameters for the known electrical appliance $\beta$ in the database of known electrical appliances. $f(\{a\}_p, \rho_q)$ is a function which provides an indication of a goodness of the fit between the real power values and corresponding reactive power values for an electrical appliance p and the one or more arc parameters for an electrical appliance q. C is referred to as 'the Correlator function' in the following description.

Advantageously, having identified the operation of an electrical appliance comprising an induction motor, the method further comprises determining the load on the induction motor at a specified time by comparing the location of the real power value and the corresponding reactive power value on the circular arc at the specified time to the real power value and the corresponding reactive power value at the start location of the arc.

According to a second aspect of the present invention, there is provided a method of identifying the operation of a specified type of appliance, where the operation of said specified type of appliance is dependent on a supply of at least one utility such as electricity, natural gas or water. The method comprises identifying the operation of a specified type of appliance when a path traced by data points in an n-dimensional space substantially corresponds to a predetermined path type associated with that specified type of appliance. Each dimension of the n-dimensional space represents a respective utility variable derived from the total supply of that utility to one or more appliances. The data points in the n-dimensional space represent values of the utility variables. Also, n>1.

Thus, the second aspect of the invention extends the methodology of the first aspect to be more generally applicable. It need not only apply to electrical appliances, but could instead apply to gas or water driven appliances. Alternatively, appliances that use two or more utilities (e.g. washing machines or dishwashers) may also be identified using the present methodology. Two or more of the variables may be derived from the same utility (e.g. real and reactive power are both derived from electricity). Utility variables may include the total electrical power supplied, the real electrical power supplied, the reactive electrical power supplied, the current supplied, the voltage supplied, the phase difference between the supplied current and voltage, the water supplied, the rate of supply of water, the gas supplied, the rate of supply of gas, the oil supplied, or the rate of supply of oil, or any derived function of one of more such variables. This list of utility variables is not intended to be exhaustive. However, it should be noted that "time" is not considered to be a utility variable in this context.

Advantageously, the method further comprises: fitting a function representative of the predetermined path type to the path traced by the data points; calculating a fit parameter representative of a goodness of the fit of the function to the path traced by the data points; and identifying the operation of the specified type of appliance by comparing the fit parameter to a predetermined threshold value.

In one embodiment, the specified type of appliance is an electrical appliance comprising an induction motor. In this case, n=2 and the utility variable represented by the first dimension of the n-dimensional space is the total real power supplied to the one or more appliances, whereas the utility variable represented by the second dimension of the n-dimensional space is the total reactive power supplied to the one or more appliances. In this embodiment, the predetermined path type comprises one or more substantially circular arcs. This ties the first and second aspects of the invention together and shows how the general methodology of the second aspect may be applied in the case of induction motor driven appliances, as in the first aspect.

When n=2, the method of the second aspect could be restated as comprising the following alternative steps: (a) determining a time series of values of a first utility measurement, the first utility measurement being derived from the total supply of that utility to one or more appliances as a function of time; (b) determining a time series of corresponding values of a second utility measurement, the second utility measurement being derived from the total supply of that utility to the one or more appliances as a function of time; and (c) identifying the operation of a specified type of appliance when a relationship between the time series of the first and second utility measurements substantially corresponds to a predetermined relationship associated with that specified type of appliance.

According to a third aspect of the present invention, there is provided a computer program comprising computer-executable code that when executed on a computer system, causes the computer system to perform a method according to one or more embodiments of the first or second inventions.

According to a fourth aspect of the present invention, there is provided a computer-readable medium storing a computer program according to the third aspect.

According to a fifth aspect of the present invention, there is provided a computer program product comprising a signal comprising a computer program according to the third aspect.

According to a sixth aspect of the present invention, there is provided an apparatus for identifying the operation of an electrical appliance comprising an induction motor. The apparatus comprises: an input section arranged to receive data representative of the total supply of electrical power to one or more electrical appliances as a function of time; and a processing section arranged to identify the operation of an electrical appliance comprising an induction motor when a path traced by real power values against corresponding reactive power values over a time period of interest comprises one or more substantially circular arcs. The real power values are related to the total real power supplied to the one or more electrical appliances as a function of time, and the corresponding reactive power values are related to the total reactive power supplied to the one or more electrical appliances as a function of time.

In one embodiment, the apparatus further comprises an analysis section arranged to analyse the received data and to determine time series of the real power values and the corresponding reactive power values over the time period of interest.

Thus, the apparatus of the sixth aspect closely corresponds to the method of the first aspect.

According to a seventh aspect of the present invention, there is provided an apparatus for identifying the operation of a specified type of appliance, where the operation of said specified type of appliance is dependent on a supply of at least one utility such as electricity, natural gas or water. The apparatus comprises: an input section arranged to receive data representative of the total supply of at least one utility to one or more appliances as a function of time; an analysis section arranged to analyse the received data and to determine a time series of data points in an n-dimensional space, each dimension of the n-dimensional space representing a respective utility variable derived from the total supply of that utility to the one or more appliances, the data points representing the received data, wherein n>1; and a processing section arranged to identify the operation of a specified type of appliance when a path traced by the data points in the n-dimensional space substantially corresponds to a predetermined path type associated with that specified type of appliance.

Thus, the apparatus of the seventh aspect closely corresponds to the method of the second aspect.

In one embodiment, the processing section is further arranged to: fit a function representative of the predetermined path type to the path traced by the data points; calculate a fit parameter representative of a goodness of the fit of the function to the path traced by the data points; and identify the operation of the specified type of appliance by comparing the fit parameter to a predetermined threshold value.

BRIEF DESCRIPTION OF THE DRAWINGS

Embodiments of the present invention will now be described by way of example with reference to the accompanying drawings in which.

DETAILED DESCRIPTION OF A PREFERRED EMBODIMENT

The method and apparatus of the present invention may be used to identify the operation of an electrical appliance comprising an induction motor. As described in the Summary of the Invention, the methodology uses inherent properties of induction motors to enable their identification and differentiation from other types of electrical appliance (e.g. resistance heaters).

The Appliance Identification Apparatus

Figure 1:
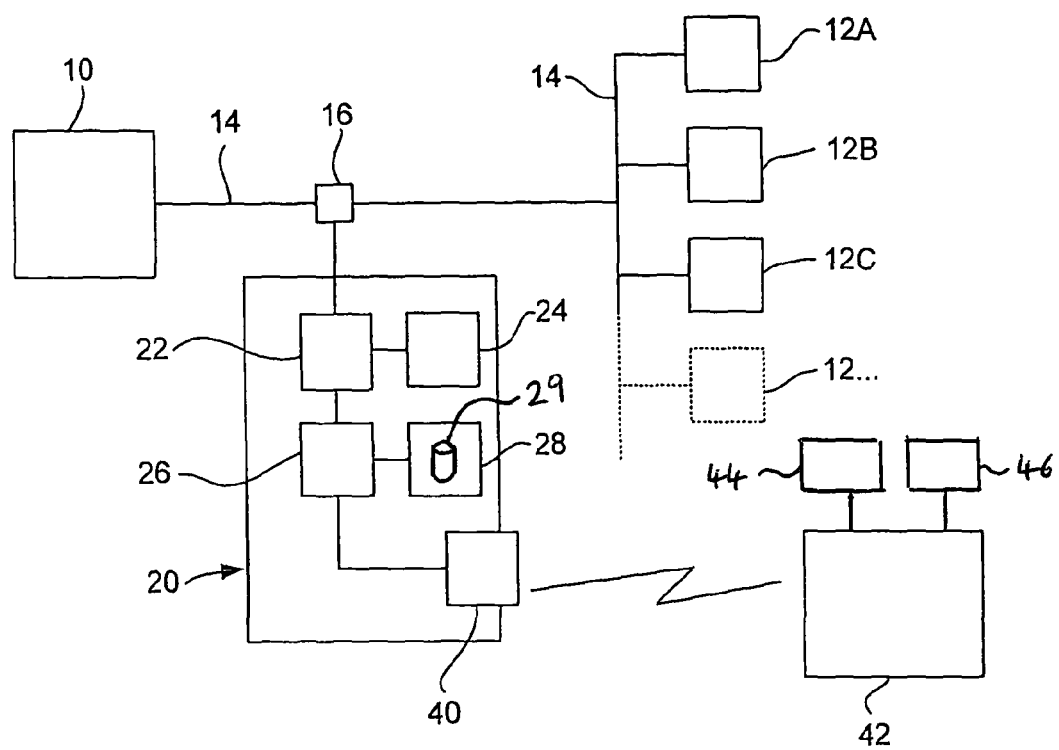
FIG. 1 depicts schematically a system using an apparatus according to an embodiment of the invention for identifying the operation of an electrical appliance comprising an induction motor.

FIG. 1 shows the hardware components of a system incorporating the apparatus for identifying the operation of an electrical appliance comprising an induction motor. In FIG. 1, the electricity supply to the site, for example a house, apartment, office, shop, school and so forth, is denoted 10. The electricity is supplied to a plurality of electrical appliances 12A, 12B, 12C, 12 . . . by means of conventional wiring 14. The appliances and wiring are simply shown schematically in FIG. 1, but may, of course, be configured in any appropriate way, such as via a consumer unit with circuit breakers or fuses, and with one or more ring main circuits with branches or spurs. A sensor 16 is provided to measure the total instantaneous current being provided to all of the appliances 12 from the supply 10, and also to measure the instantaneous voltage of the electricity supply 10. The current is measured by any suitable sensor, for example a current clamp placed around one of the conductors of the electricity supply wiring 14. The current clamp typically comprises a magnetizable material, such as ferrite, which forms a magnetic circuit around the conductor, and acts as a transformer to induce a voltage in a secondary winding around the magnetizable material, from which the current flowing in the supply wiring 14 can be obtained. As an alternative to this current-transformer, a Hall-effect sensor can be used to measure the magnetic field in the loop of magnetizable material around the wire which is related to the current flowing through the wire. Other suitable ways may, of course, be used for sensing the current.

The voltage of the electricity supply can also be measured by any suitable volt meter. This, of course, typically requires access to two of the conductors in the wiring 14. This can be achieved, for example, by probes which strap around the respective cables and have spikes which penetrate the insulation to make contact with the conductor. Alternatively, connections could be made to terminals in the consumer unit, or, for example, at a location where fuses or circuit breakers are insertable. Non-invasive capacitive voltage detectors could also be used. Alternatively, the voltage may be inferred by assuming a constant voltage supply and simply working of the phase of the current against the voltage (which could be measured without a full voltage measurement). In this case, only measurements of the current and the phase difference are required.

As shown in FIG. 1, the sensor 16 is connected to the apparatus 20. It is, of course, possible that some or all of the sensor 16 is incorporated within the apparatus 20, for example that wires connect the supply wiring 14 to the apparatus 20, and the voltage is measured within the apparatus 20. Alternatively, in a different embodiment, the sensor 16 may be self-contained and may communicate with the apparatus 20 wirelessly, sending analogue or digital values of the instantaneous current and instantaneous voltage. In one option, the apparatus 20 can derive its own power supply by virtue of being connected to the portion of the sensor 16 for measuring voltage. In one particular form of this, the apparatus 20 is simply plugged into an electrical outlet in the same way as an appliance 12 to obtain its power supply and also to measure the supply voltage. However, in the preferred embodiment, the apparatus 20 and sensor 16 are conveniently located near where the utility supply 10 enters the building, such as near where the conventional electricity meter is or would be located.

The apparatus 20 comprises a number of different units, namely an input section 22, a clock 24, a processor 26, a store or memory 28, and an output section 40. It is possible to implement each of the various units as dedicated hard-wired electronic circuits; however the various units do not have to be separate from each other, and some or all could be integrated onto a single electronic chip such as an Application Specific Integrated Circuit (ASIC) or Field Programmable Gate Array (FPGA) or Digital Signal Processor (DSP) device. Furthermore, the units can be embodied as a combination of hardware and software, and the software can be executed by any suitable general-purpose microprocessor, such that in one embodiment the apparatus 20 could be a conventional personal computer (PC). The software would take the form of one or more computer programs having computer instructions which, when executed by a computer (e.g. processor 26) carry out a method according to an embodiment of the present invention as discussed below. The computer programs may be stored on a computer-readable storage medium, such as a magnetic disc, optical disc (e.g. a CD or DVD), etc.

The input section 22 of the apparatus 20 receives current and voltage values from the sensor 16. The raw values may be filtered to reject spurious noise. The current and voltage values are input or measured preferably multiple times per cycle of the alternating electricity supply to a level of accuracy as required by the application. If the values are supplied as analogue voltages, then the input section 22 may comprise, for example, an analogue to digital converter, such that the rest of the apparatus 20 can be implemented using digital electronics. The input section 22 may also receive time data from the clock 24. The clock 24 may provide the actual present time and/or may provide an accurate timing signal for use when sampling the input current and voltage values. The clock 24 could, of course, be integral with other components of the apparatus 20, or could be part of the sensor 16, or could receive a clock signal from an external source such as a transmitter broadcasting time data. In one embodiment the clock 24 comprises a quartz oscillator together with other timer circuitry that is an integral part of the processor 26. In this case, the input section 22 for receiving the time data is also an integral part of the processor 26.

The memory 28 stores a database 29 of information/data regarding various known electrical appliances. The power consumption of some appliances is variable. For example, a washing machine will consume considerably different amounts of power during different portions of a washing program/cycle and this will differ from program to program. All such data is retained in the memory 28 for each known appliance. The memory 28 may be any suitable computer-readable storage medium, such as a solid-state computer memory, a hard drive, or a removable disc-shaped medium in which information is stored magnetically, optically or magneto-optically. The memory 28, may even be remote from the apparatus 20 and accessible, for example, via a telephone line or over the internet. The memory 28 may be dynamically updateable, for example by downloading new electrical appliance data. This could be done via the supply wiring 14 itself or, in one optional version, the memory 28 is provided as an IC-card insertable by the user into a slot in the apparatus 20. Manufacturers of electrical appliances provide the necessary appliance data either directly to the consumer, or to the utility company. New IC-cards can be mailed to the user to update their apparatus 20. The software that the processor 26 runs to perform the analysis may also be stored in the memory 28 and updated as desired in the same ways as the appliance data (e.g. by downloading, by inserting a new medium such as a disc or IC-card, and so on).

The processor 26 receives data from the input section 22, the memory 28 and possibly the clock 24. The processor could be a general purpose processing device or could be a digital signal processor or could be a bespoke hardware device (e.g. FPGA or ASIC) manufactured specifically for implementing one or more embodiments of the invention. The processor then performs various processing/analysis steps which are described in detail below. Following the processing/analysis, the processor 26 produces information regarding electrical energy utilisation for some or all of the electrical appliances 12. This information may be transmitted directly to the utility provider. Alternatively, this information may be output by the output section 40 to a user terminal 42 (such as a PC or a dedicated device for utility-use feedback)

so that the information can be conveniently presented to the user. The user terminal 42 can be a standard desktop or laptop computer with an attached monitor/display 44 and/or printer 46, or can be a dedicated device.

Although the apparatus 20 and the user terminal 42 are shown as separate devices in FIG. 1, they could, of course, be part of the same device. The output section 40 in the preferred embodiment communicates wirelessly, for example by radio frequencies (RF) link, or optically, or by infrared, or acoustically. However, it is also possible that the communication with the user terminal 42 is done through the supply wiring 14 if the user terminal 42 is plugged into one of the supply outlets as an appliance. In a further embodiment, the output section 40 can also act as a receiver, such that communication between the apparatus 20 and user terminal 42 is two-way. This enables the user terminal 42 to be used as a further means for updating the electrical appliance data in the memory 28.

An Overview of the Appliance Identification Method

Figure 2:
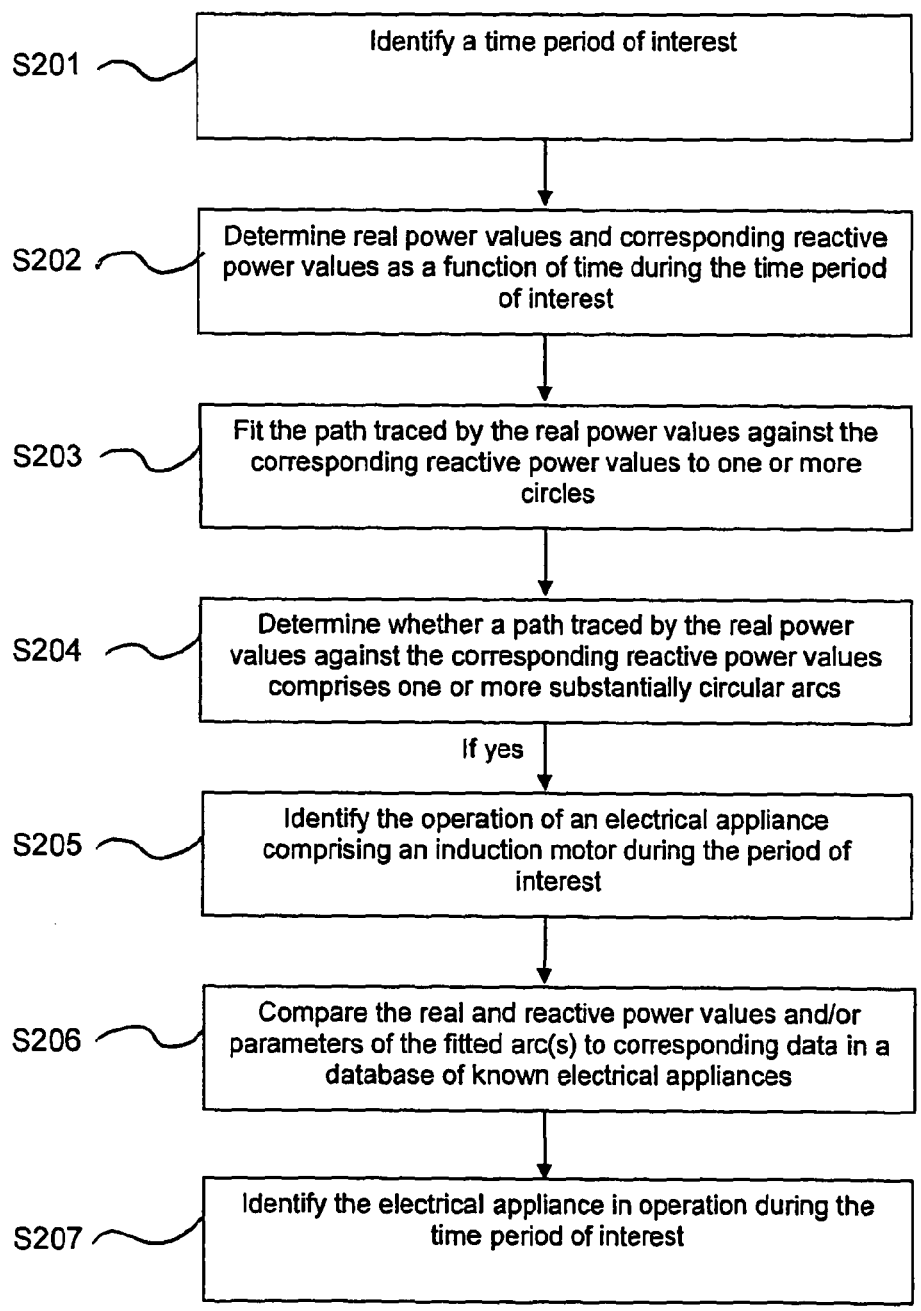
FIG. 2 is a flow chart showing an overview of the steps performed during a method according to one embodiment of the present invention for identifying the operation of an electrical appliance comprising an induction motor.

An overview of the operation of the processor 26 is shown in FIG. 2. In particular, FIG. 2 shows the method steps performed by the processor 26 in one embodiment of the present invention. The voltage and current values together with the optional time data are received by the processor 26. The processor 26 identifies a time period of interest in step S201. From the raw current and voltage data, the processor 26 calculates a number of coefficients to characterise the present usage. For example, in step S202, the processor 26 determines a time series of real power values representative of the total real power supplied to the appliances 12 as a function of time, and the processor 26 further determines a corresponding time series of reactive power values representative of the total reactive power supplied to the appliances 12 as a function of time. In step S203, the processor 26 fits the path traced by the real power values against the reactive power values to one or more circles. Based on the fit data, the processor 26 determines in step S204 whether the path traced by the real power values against the corresponding reactive power values comprises one or more substantially circular arcs. If the path does comprise one or more substantially circular arcs then, in step S205, the processor 26 identifies or infers that an electrical appliance comprising an induction motor is in operation during the time period of interest. In this case, the method proceeds to step S206 where the real and reactive power values and/or parameters of the fitted arc(s) are compared to corresponding data in the database 29 of known electrical appliances. The database 29 is stored in the memory 28 of the apparatus 20. Based on the output of the comparison step S206, the processor 26 identifies the induction-motor-driven electrical appliance in operation during the time period of interest. The method performed by the processor is described in further detail below.

Identifying a Time Period of Interest

The step S201 requires the identification of a time period of interest, i.e. a time period over which the subsequent data analysis is performed. The step of identifying the time period of interest may comprise: specifying a trigger condition relating to the total power being supplied to the one or more electrical appliances; determining a time at which said trigger condition is satisfied by the total power supplied; and identifying the time period of interest as being a time period following the determined trigger time. The time period of interest may be a period immediately following the switch-on of an electrical appliance 12, or may be a change in operating conditions of an appliance (e.g. a change of speed of a washing machine motor due to a transition between different parts of a washing machine program/cycle, for example). The switch-on of an electrical appliance may be identified in a number of ways. For example, a sharp increase in the total power consumption by the plurality of appliances 12 would normally be indicative of one of the appliances being switched on and could thus be used as a suitable trigger condition for the start of the time period of interest. The end of the time period of interest could then be identified in a number of ways. For example, the end of the time period of interest might be defined as being the time at which the total power consumption stabilises, indicating that the switched-on appliance has reached a steady state. Alternatively, the time period of interest may have a fixed length such that the end of the time period of interest is a fixed time after the start of the time period of interest. In other embodiments, a time period of interest may be identified as any period of varying (i.e. non-constant) power consumption.

Determining Time Series of Real and Reactive Power Values

Figure 3:
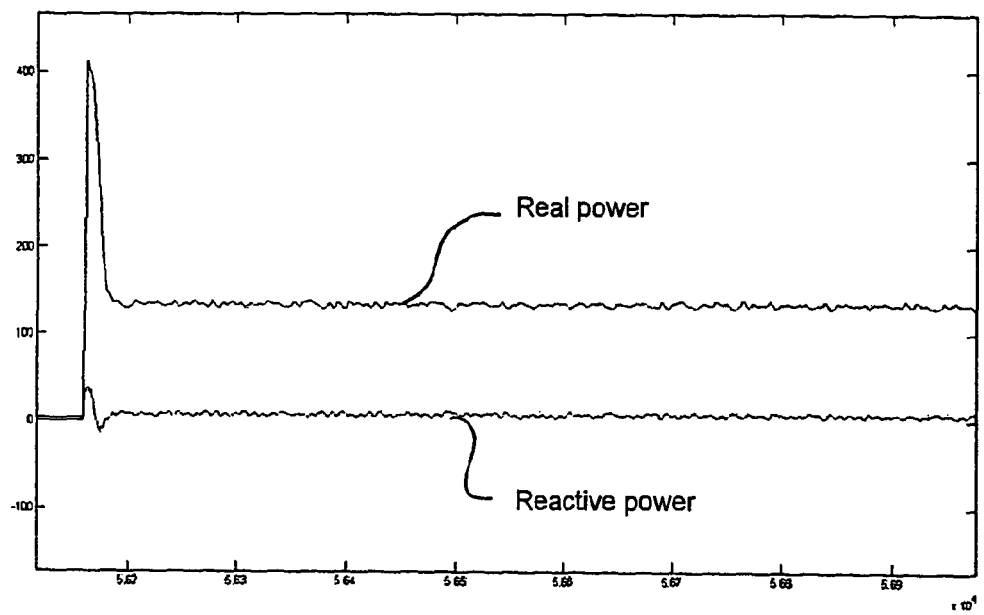
FIG. 3 is a graph of real power (top line) and reactive power (bottom line) supplied to an installation as a function of time; a tumble dryer is switched on during the period shown.

FIG. 3 shows real power and reactive power time series following the turn on of a tumble dryer. Initially, there is a sharp increase from zero in both the real and reactive powers. The real power then drops off to stabilise at an approximately constant value. Following the initial sharp increase in the reactive power, the reactive power drops to a negative values, before increasing to stabilise at an approximately constant value. In this case, the stabilised real power value is greater than the stabilised reactive power value.

The power is calculated each electrical cycle (electricity is typically supplied at 50 or 60 Hz so one cycle is approximately 0.02 seconds). Prior art methods have tended to only take low time resolution readings (e.g. 1 Hz), but a higher time resolution is used in this methodology.

In step S202, the processor 26 determines time series of real power values and corresponding reactive power values during the identified time period of interest. In a preferred embodiment, the real power P and the reactive power Q are calculated as follows:

$$P = \sum_{i=0}^{n} \frac{V_i I_i}{n} \text{ and } Q = \sum_{i=0}^{n} \frac{V_i I_i^{90}}{n}$$

where V is the instantaneous voltage, I is the instantaneous current, $I^{90}$ is the instantaneous current phase shifted by 90 degrees, and the summation is over the electrical cycle consisting of n points. If one or more appliances are already switched-on prior to the observed transient (i.e. if the real and reactive powers are not initially around zero), then it is desirable to subtract these 'base load' measurements of real and reactive power from the transient time series of real and reactive power so as to obtain values relating only to the power consumed by the newly switched-on appliance. One method is to take the base load power as being the measured power immediately prior the transient, and to subtract this from each subsequent power value. This assumes the base load is constant. One way to account for a varying base load is to calculate the mean and variation in the base load over a longer period of operation and thus obtain a representative average power which is then subtracted from the measured power. A further possibility is to measure the base load mean and variation also after the further appliance has switched off (by detecting the switch-off event) and if this is different from the base load prior to the appliance being switched on, then a linear variation in base load between the on and off events of the appliance under observation can be assumed and accordingly subtracted from the measured total power to obtain the power consumption of the appliance in question.

In a preferred embodiment, the first two points following the switch-on are discarded in order to allow the settling of fast observed transients caused by the switch-on. Thus, in this case, the time period of interest starts shortly after the specified trigger condition (i.e. a sharp increase in power) has been satisfied. Having discarded the first couple of points, a number of points (e.g. 50 points) following the switch-on are then analysed. For example, real power and reactive power points 2-52 following the transient may be analysed. Thus, in this case, a fixed length is used for the time period of interest. The number of points for the analysis has been arbitrarily chosen as 50 since this seems to give the full transient for the slowest of machines. However, it will be appreciated that a different number of points could be used. Alternatively, the number of points for the analysis could be chosen based on $$\frac{dP}{dt} \text{ and/or } \frac{dQ}{dt}$$

being above a threshold. As a further alternative, an iterative solution may be used whereby we continually attempt to identify circular characteristics and optimise against the number of points.

Circle Fitting

In step S203, the processor 26 fits the path traced by the real power values against the reactive power values to one or more circles. There is a significant volume of literature regarding the fitting of circles to observed data points, and any circle-fitting technique may be used in accordance with the present invention. For example, the problem may be formulated as a non-linear least squares minimisation problem. However, this can be computationally inefficient and is sensitive to outliers. Therefore, in one advantageous embodiment, the technique developed by Kåsa is used to transform the problem to a linear least squares formulation that is trivially solved ("A curve fitting procedure and its error analysis" by I. Kåsa, IEEE Trans. Inst. Meas., 25, 8-14, 1976). The Kåsa technique is used in the embodiments described below for the purposes of illustration. However, the Kåsa technique has an inherent bias to fit circles of small radius. Therefore, it is more advantageous to use improved circle-fitting techniques which reduce the bias inherent in the Kåsa technique. Such techniques include the Pratt technique ("Direct least-squares fitting of algebraic surfaces" by V. Pratt, *Computer Graphics*, 21, 145-152, 1987) and the Taubin technique ("Estimation of planar curves, surfaces and nonplanar space curves defined by implicit equations, with applications to edge and range image segmentation" by G. Taubin, *IEEE Trans. Pattern Analysis Machine Intelligence*, 13, 1115-1138, 1991). Both the Pratt and Taubin techniques can be solved by linear algebraic methods, or alternatively by Newton Raphson methods.

Figure 4:
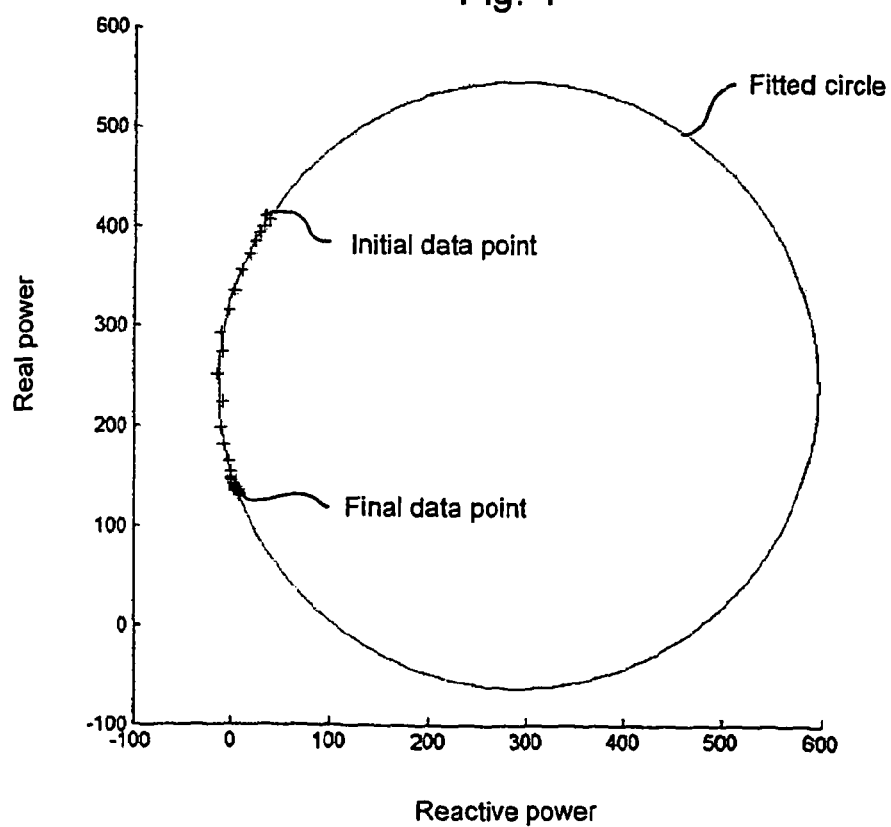
FIG. 4 is a graph of real power (y-axis) against reactive power x-axis) during the switch-on period of the tumble dryer shown in FIG. 3: the observed data points are shown as crosses, and a circle fitted to the observed data points is shown as a continuous line.

In one embodiment, the observed real and reactive power values are fitted to a single circle. FIG. 4 shows the results of running this analysis on the power transient in FIG. 3. Reactive power is shown on the x-axis and real power is shown on the y-axis. The observed data points are shown as crosses, and the fitted circle is shown as a continuous line. It is clear that the observed data fit very well to the circle shown. The observed data points form an arc around part of the circumference of the fitted circle. The initial data point is reasonably reproducible for a given induction motor driven electrical appliance. The vector (not shown) between the centre of the fitted circle and the initial data point is invariant to the 'base load' on the induction motor. The angular range of the data points around the circle gives a measure of the loading of the induction motor driven electrical appliance.

As an output, the circle fitting step S203 provides one or more circle/arc parameters which define the fitted circle/arc. Possible circle/arc parameters may include the circle radius r, the centre location of the circle $\underline{x}$, the start location of the arc, the angular range of the arc, the length of the arc, etc. The circle/arc parameters which are output depends on the processing which occurs thereafter.

Assessing how Good the Circular Fit is

Having fitted a circle to the data points, the processor 26 next identifies, in step S204, how good the circular fit is. Note that the technique is a least squares optimisation so it will fit a circle to any set of data points, regardless of whether the underlying model follows a circle. Therefore, it is necessary to determine how well the observed data fit to the least squares fitted circle.

The function $F_{Kåsa}$ that is minimised using the Kåsa technique can be stated as follows:

$$F_{Kåsa} = \sum_{j=1}^{m} \left( \|\underline{a}_j - \underline{x}\|^2 - r^2 \right)^2$$

where $\underline{a}$ is a 2×m matrix of the observed real and reactive power values such that $\underline{a}_j$ represents the jth the observed data point (i.e. the real and reactive power values at adapt point j), $\underline{x}$ is the centre of the circle, r is the radius of the circle and m is the number of data points. Hence, the Kåsa technique uses a linear least squares type algorithm to find a minimum value of $F_{Kåsa}$, this minimum value being denoted F*. In other words, F* is one of the outputs of the Kåsa circle fitting algorithm. Therefore, a single circle fit parameter $f_1$ is defined as follows:

$$f_1 = \frac{F^*}{m(r^*)^4}$$

where r* is the value of r corresponding to F*. Dividing F* by $(r^*)^4$ ensures that the fit parameter $f_1$ is not biased by the radius. Similarly, dividing F* by m ensures that the fit parameter $f_1$ is not biased by the number of fitting points. If there is only a small number of data points (i.e. if m is a small number), then a divisor of (m−3) may be used instead of m to provide better results.

Thus, the 'circleness' of a set of data points can be characterised by the value of the single circle fit parameter $f_1$. A perfect circle would yield a value of $f_1$=0. In reality the presence of noise on the signal and imperfections in the model mean that there has to be a threshold $f_{threshold}$. If $f_1 < f_{threshold}$ then the observed data points are considered to lie on a circle, whereas if $f_1 \leq f_{threshold}$ then the observed data points are considered not to lie on a circle. In a preferred embodiment, the present invention sets $f_{thresold}$=5×10⁻³, but other values may clearly be used within the scope of the invention. Using this model, the data shown in FIGS. 3 and 4 are found to have a circular relationship (i.e. $f_1 < f_{threshold}$). Of course, other fit parameters may alternatively be used to measure how well the observed data fit to a circle. A different fit parameter may be used in conjunction with the Kåsa technique for circle fitting. Additionally, if a circle fitting technique other than Kåsa is used, then a different fit parameter may be defined based on that technique. For example, the function $F_{pratt}$ to be minimised in the Pratt technique is defined as:

$$F_{pratt} = \frac{F_{Kasa}}{4r^2}$$

so a different fit parameter might be defined in this case.

If, based on threshold comparison in step S204, it is found that the observed data points lie on a circular path then, in step S205, it is inferred that an electrical appliance comprising an induction motor was in operation during the period of interest. In particular, it is inferred that an induction motor was in operation and was changing its power consumption during this period. Induction motors may be in operation at other times when the observed data points do not lie on a circular path, but the power consumption of the induction motor would be constant in this case.

Reducing Instances of 'False Positives'

It is possible that, on occasion, the circle algorithm will fit a circle to a set of data points which appear to lie on a circle, but are not in fact representative of an induction motor. Such an occurrence is referred to as a 'false positive'. It is possible to at least reduce the number of instances of false positives by introducing a few further processing steps as described below.

Figure 5:
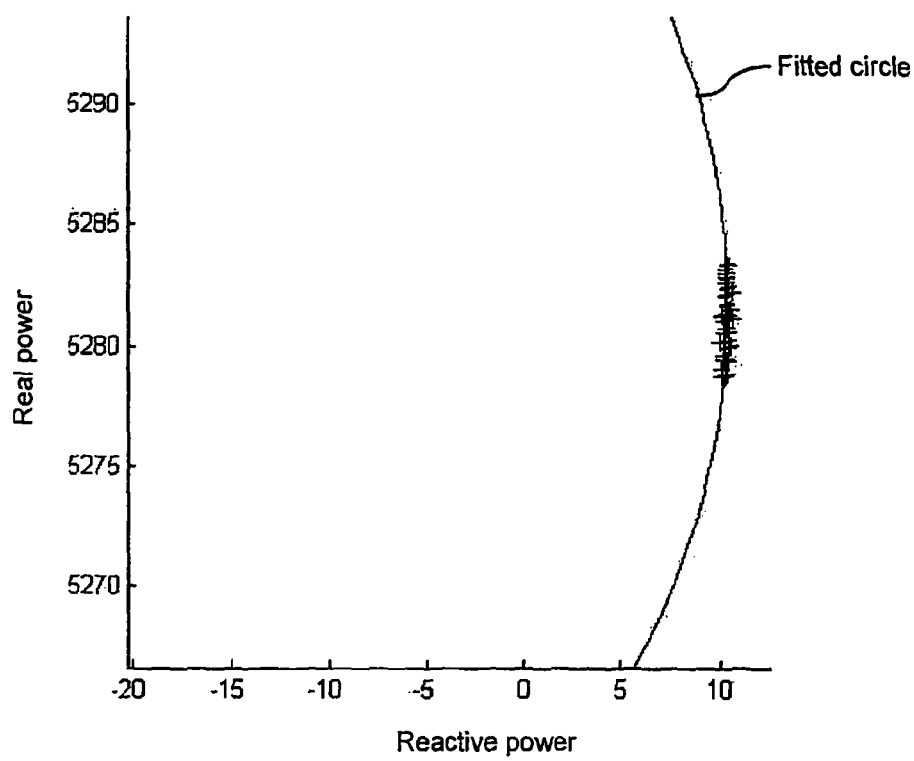
FIG. 5 is a graph of real power (y-axis) against reactive power x-axis) during the switch-on period of a purely resistive device: the observed data points are shown as crosses, and part of a circle fitted to the observed data points is shown as a continuous line.

When a purely resistive device turns on, it shows a real power decay over a number of cycles, resulting in a linear locus on the plot of real against reactive power. In this case, it is always possible to fit a circle of infinite radius to the points with a strong fit, since for a circle of infinite radius, a small arc approaches a straight line. An example of switching on a purely resistive device is shown in FIG. 5. Reactive power is shown on the x-axis and real power is shown on the y-axis. The observed data points are shown as crosses. The reactive power is substantially constant over the switch on of the device. Nonetheless, as a result of performing the circle-fitting method described above, a circle of large radius is fitted to the observed data points. Part of the fitted circle is shown as a continuous line in FIG. 5. Because there is a good fit between the observed data points and the large fitted circle, it is found in step S204 that the observed data points have a substantially circular relationship, and it is thus inferred that an electrical appliance comprising an induction motor was in operation during the period of interest. However, this inference is incorrect on this occasion. This is an example of a false positive which it is desired to avoid. To account for this, it is possible to disregard circles for which the observed data points lie on an arc which spans an angle less than some threshold (e.g. 15 degrees in one embodiment, although it will be appreciated that other thresholds could be used in this regard). The angular range of the data points in FIG. 5 is very small compared to that in FIG. 4 because the radius of the fitted circle is so large in FIG. 5. Thus, the observed data in FIG. 5 would not pass the 'angular range' test, and no induction motor driven appliance would be identified.

For a true single phase induction motor, the data points will traverse the segment of the circle to the left of the centre in a plot of real versus reactive power. This is clearly the case for the induction motor device in FIG. 4. In other words, the reactive power at the centre of the fitted circle is greater than the reactive power for the observed data points. This could be tested, for example, by comparing the reactive power at the centre of the fitted circle to the average reactive power for the observed data points. As with the 'angular range test', this 'centre location' test may be used to discount a number of false positives. For example, the observed data for the purely resistive device in FIG. 5 would fail the 'centre location' test since the centre of the fitted circle is on the left hand side of the observed data points, rather than on the right hand side.

Figure 6:
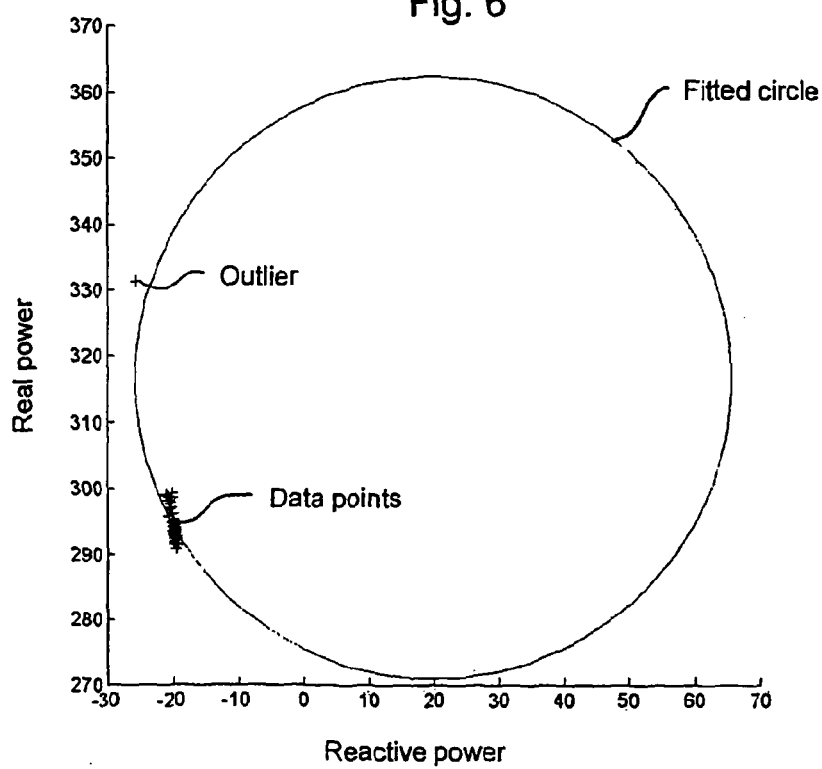
FIG. 6 is a graph of real power (y-axis) against reactive power x-axis) during the switch-on period of a group of incandescent light bulbs: the observed data points are shown as crosses, and a circle fitted to the observed data points is shown as a continuous line.

Other false positives may occur for devices such as incandescent light bulbs that have a rapid change in power. In such cases, there may be one or two points which are far away from the main distribution of observed data points such that the data may well pass the 'angular range' test described above. However, this type of behaviour in not seen with induction motor driven devices, so should be disregarded. An example of switching on an incandescent light bulb is shown in FIG. 6. Reactive power is shown on the x-axis and real power is shown on the y-axis. The observed data points are shown as crosses. One outlying data point is clearly seen. The circle fitted to the observed data points (including the outlier) is shown as a continuous line. However, it is clear that a very different circle would be fitted if the outlying data point were ignored. There are various methods that one could use to detect this sort of behaviour. For example one could measure the average angular distance between points and discard outliers.

Alternatively, when implementing the 'angular range' test, one could measure the angular distribution of points 5-50, for example, to discard potential early outliers. As a further alternative, one could discard the first couple of points, and attempt to refit the circle. If the circle parameters change significantly (as they would in FIG. 6), then one could again infer that this was not an induction motor type circle.

'Notches'

Figure 7:
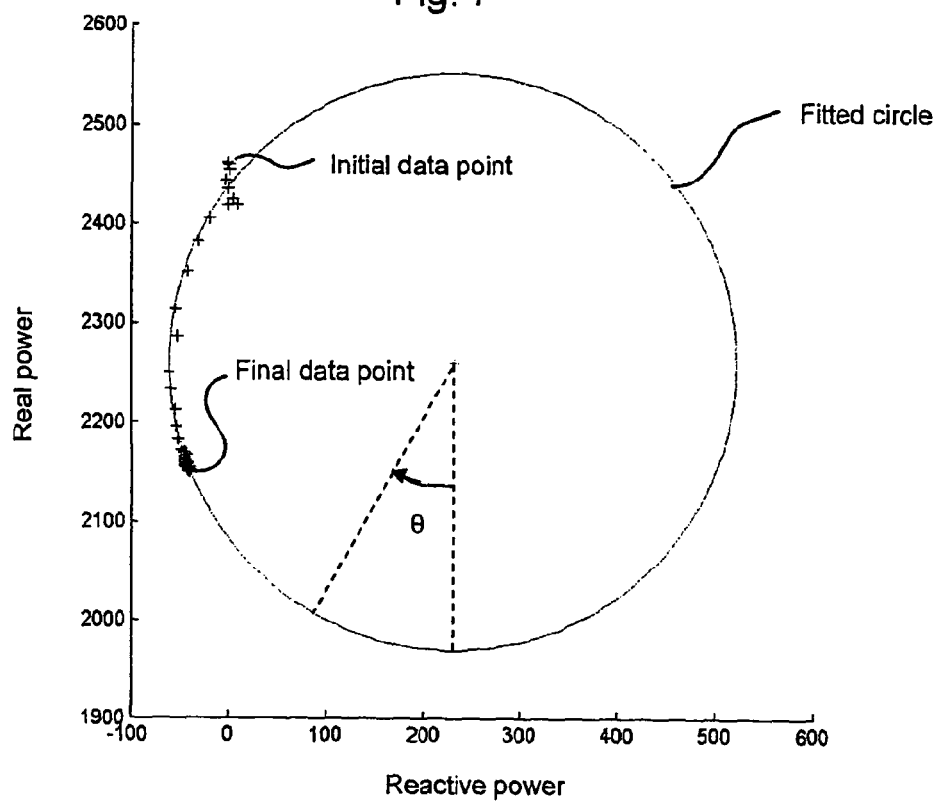
FIG. 7 is a graph of real power (y-axis) against reactive power x-axis) during the switch-on period of another electrical appliance (a tumble dryer) comprising an induction motor: again, the observed data points are shown as crosses, and a circle fitted to the observed data points is shown as a continuous line.

It should be noted that the circle models an ideal motor. In reality, the observed data do not follow an exact circle. For example, FIG. 7 shows another set of observed data points. As in FIG. 4, reactive power is shown on the x-axis and real power is shown on the y-axis. The observed data points are shown as crosses, and the fitted single circle is shown as a continuous line. There are a number of data points at the start of the observed data which fit less well to the circle than the data points towards the end of the observed data. In particular, in the top left of the 'circle' there is a 'notch' where the reactive power is less than would be expected, and then becomes larger than expected, before settling to the values predicted by the single circle model.

Observed data for induction motors often include a notch of the type shown in FIG. 7. Notches arise for a variety of underlying physical reasons based on the geometry of the motor itself. For example, a notch may arise due to space harmonics which are a function of the motor winding geometry. A notch is a repeatable characteristic of a specific motor. The effect of the notch in the present method is to increase the value of the single circle fit parameter $f_1$ defined above. However, it is possible to account for notches in the present method. For example, the notched portion of the observed data may be removed from the analysis. One method of notch removal is described below.

Figure 8:
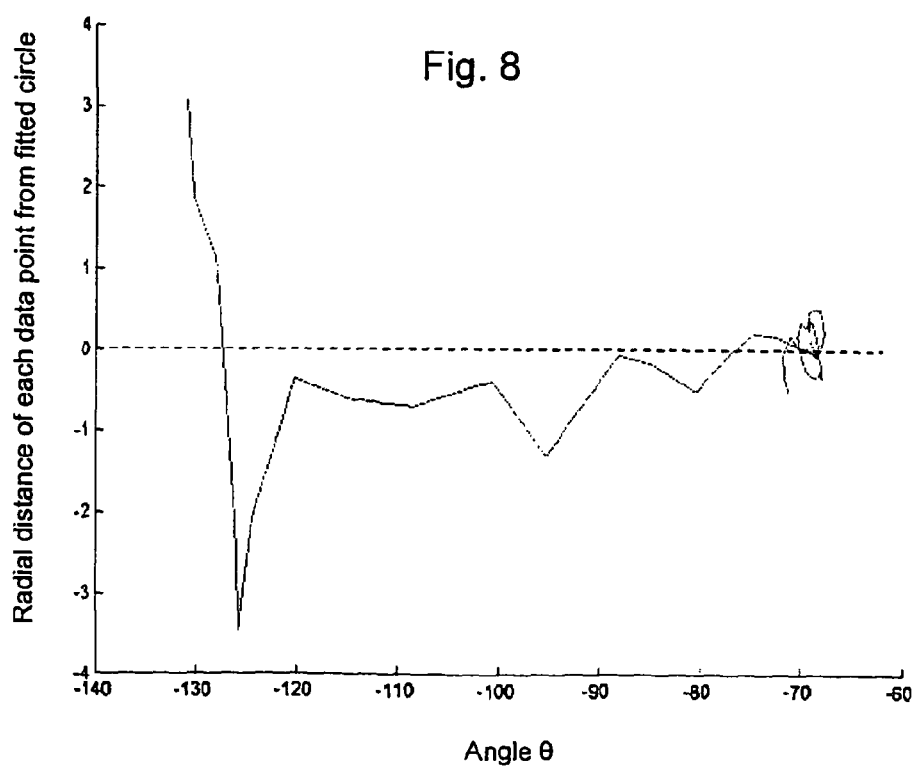
FIG. 8 is a graph showing the data points of FIG. 7 in terms of the radial distance from the circumference of the fitted circle (y-axis) as a function of angle x-axis): the radial distances are normalised by the standard deviation of the data points from the fitted circle.

FIG. 8 shows the radial distance of each observed data point from the fitted circle's circumference as a function of angle. The presence of the notch is clearly visible as an increase in the magnitude of the distance between −130° and −120°. One possible method of removing the effects of this notch would be to calculate the standard deviation of the m points around the radius. Then, any points which fall outside 1.5 standard deviations, for example, could be considered as outliers and moved onto the radius instead. This improves (i.e. reduces) the value of the single circle fit parameter $f_1$. Assuming that the noise model is Gaussian, then this is a valid technique since prior information is being used to improve the model.

It should be noted that the notch 'outliers' shown in FIGS. 7 and 8 are different from the incandescent light bulb outlier(s) described above with reference to FIG. 6. For example, the outliers in FIG. 6 are located at a substantial distance from the remainder of the observed data points, whereas this is not the case for the notch 'outliers'. In addition, the angular range of the non-outliers in FIG. 6 is very small compared to when the outliers are included in the analysis, whereas the angular range of the non-outliers is much larger in FIG. 7, regardless of whether the outliers are included in the analysis or not. These differences may be used to distinguish between the type of outlier.

Fitting to Two Circles

Figure 9:
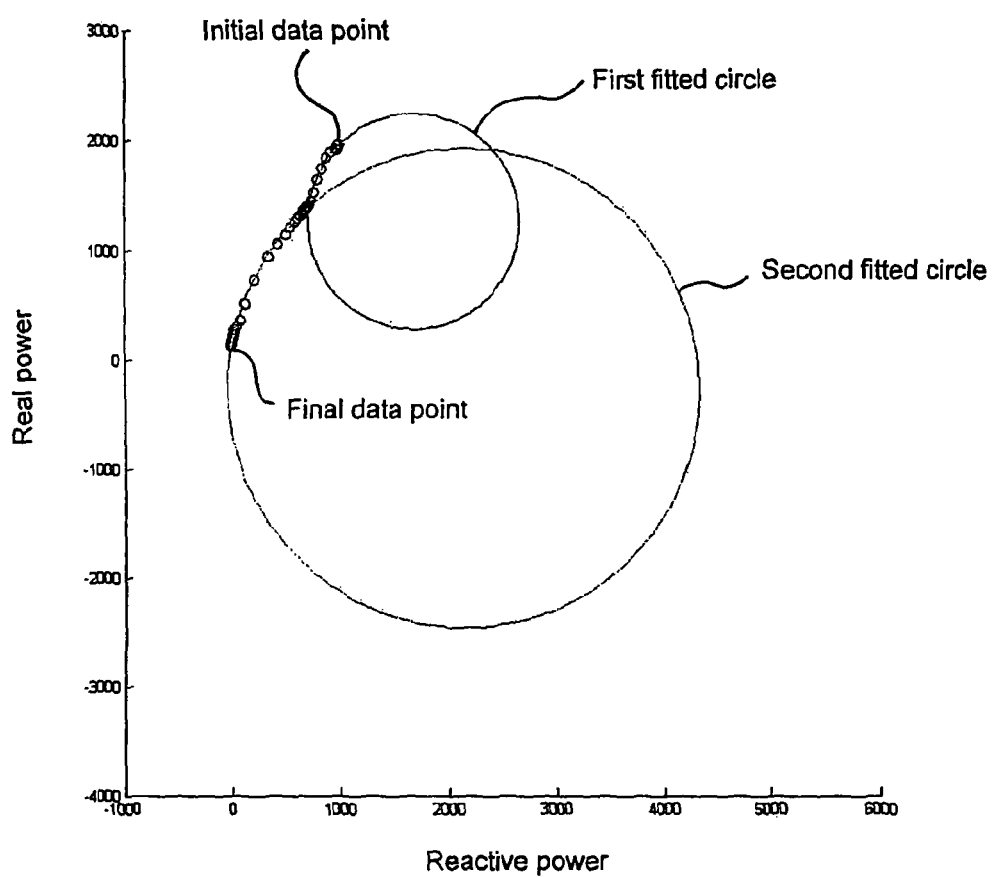
FIG. 9 is a graph of real power (y-axis) against reactive power x-axis) during the switch-on period of another electrical appliance (a refrigerator) comprising an induction motor: the observed data points are shown as small circles, and two larger circles fitted to the observed data points are also shown.

As an alternative to removing the notch, it is possible to fit the notch data to a separate circle as part of step S204 of the present method. When a real induction motor starts up, a mechanism is required to start it turning. This is normally achieved by switching in extra electrical components onto one of the motor windings for a short time before the motor reaches full speed. The result is that the motor is electrically different on start-up. In fact, the real and reactive power values follow a different circular path before settling onto the normal motor circle. An example of this 'double circle' behaviour is seen in FIG. 9, which shows another set of observed data points. As in FIGS. 4, 6 and 7, reactive power is shown on the x-axis and real power is shown on the y-axis. The observed data points are shown as small circles, and the fitted double circles are clearly shown as continuous lines. The first 'start-up' circle has a smaller radius than the second 'normal operation' circle. Furthermore, the first and second circles have different centre points. From a visual inspection, it is clear that the observed data fit very well to the 'double circle' model. Thus, it is believed that a 'notch' results from a motor transitioning between a first 'start-up' circle and a second 'normal operation' circle. Hence, it is preferable to fit the data to two circles, rather than to remove the notch as described above. One method of fitting to a two circle model is described below with reference to the flow chart of FIG. 10. However, it will be appreciated that other double-circle fitting methods would also be appropriate.

Even when performing a double-circle fit, it is useful to calculate how well the observed data points fit to a single circle. Therefore, a single circle is initially fitted to the observed data set in step S1001, and a single circle fit parameter $f_1$ is obtained for that fit. This single circle fit parameter $f_1$ is retained for further analysis later on (see step S1006 described below).

In step S1002, the same observed data is partitioned into two sequential (i.e. consecutive) data sets. The two partitioned data sets are the fitted to separate circles in step S1003. For example, when using 50 observed data points, the 50 point data set is partitioned into the first i points, and then the final 50−i data points, with a different circle being fitted to each partitioned data set. This results in a first fitted circle with radius $r_1^*$ and centre point $\underline{x}_1^*$, and a second fitted circle with radius $r_2^*$ and centre point $\underline{x}_2^*$ once the two single circle fit parameters $f_1$ have each been minimised using the least squares circle fitting algorithm of the Kåsa technique. A double circle fit parameter $f_2$ is then defined as follows:

$$f_2 = \frac{1}{m-6}\left(\frac{\sum_{j=1}^{i}(\|a_j - \underline{x}_1^*\|^2 - (r_1^*)^2)^2}{(r_1^*)^4} + \frac{\sum_{j=i+1}^{m}(\|a_j - \underline{x}_2^*\|^2 - (r_2^*)^2)^2}{(r_2^*)^4}\right)$$

Thus the double circle fit parameter $f_2$ is the sum of the single circle fit parameters for each of the two circles with its corresponding data points, albeit normalised by m−6 rather than by m as for the single circle fit parameter $f_1$. One could still normalise by m, but m−6 produces better results and is statistically more consistent. Of course, this is just one example of a double circle fit parameter, and one skilled in the art will recognise that many alternative definitions of the double circle fit parameter could be used in accordance with the present method.

Having defined a double circle fit parameter $f_2$, one can vary the partitioning of the data set, i.e. one can partition the data set with different values of i (see step S1004), and calculate the double circle fit parameter $f_2$ in each case (see step S1003 again). In other words, an iteration over values of i is performed to find the best double-circle fit. It is not advantageous to fit a circle to only a small number of points as it is very easy to over-fit the data in such cases. Therefore, it is desirable to only partition with, say, 10 or more data points in each partition. Furthermore, given the prior knowledge that the transition point between the circles happens in the earlier part of the transient, it may only be desirable to partition using $10 \leq i \leq 35$, for example. However, if desired, one could of course iterate from i=4 to i=48, for example. Additionally, one does not have to test every value of i and could instead sample at regular points throughout the range (e.g. even values of i only); this sampling would reduce the processing/analysis time for a given set of observed data points.

Having iterated over the range of i, the value of i that produces the smallest value of $f_2$ is selected (see step S1005) and this is taken to best define the position of the transition of the observed data from the first circle to the second circle, which is located at an intersection between the two fitted circles.

At this stage, one possible approach would be to simply choose the fit value as the minimum of $f_2$ and thus parameterise the data with two circles accordingly. However, this may potentially lead to over-fitting of the data. For example, consider the case that the observed data follows a perfect circle. In this case, it would be possible to partition the data at any point and fit two circles, each with the same parameters to the two partitions. Now consider a small deviation from the circle due to noise. In this case, the fit of two circles will always perform better than one circle on account of the fact that we are parameterising the data with an extra three values (namely the partition point i, and the radius and centre point of the additional circle). Nonetheless, a single circle fit would actually be more appropriate in this instance.

Therefore, depending on the observed data in question, it is sometimes better to use a single circle fit and it is sometimes better to use a double circle fit. It order to choose whether to fit to one or two circles, the single and double circle fit parameters $f_1$ and $f_2$ may be compared in step S1004. One advantageous embodiment of the invention avoids over-fitting by penalising the double-circle fit compared to the single-circle fit using a penalty value p. Hence, if $f_1 < (f_2+p)$, then a single circle is used as the best fit for the observed data. In contrast, if $f_1 > (f_2+p)$, then a double circle is used as the best fit for the observed data. The penalty value p may be chosen arbitrarily to produce good results. In one embodiment, a value of p=0.001 is used, but other values may be chosen.

Figure 10:
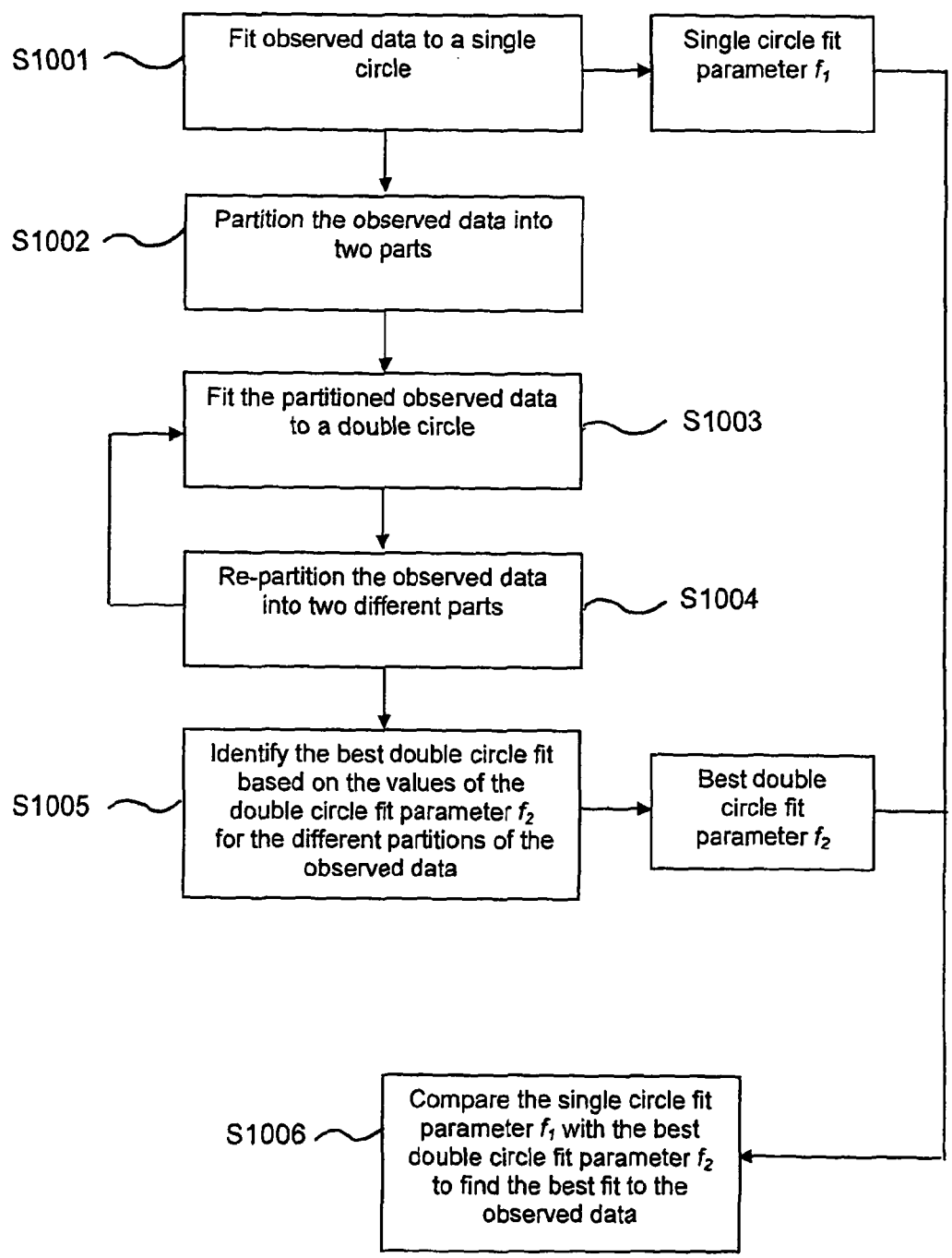
FIG. 10 is a flow chart showing an overview of fitting a double-circle to the observed data in one embodiment of the present invention.

In an alternative embodiment, it would be possible to combine the single circle 'notch' methodology with the double circle methodology described above so as to avoid the need for the iterative partitioning of the observed data into two parts (i.e. steps S1003, S1004 and S1005 in FIG. 10). In particular, rather than using iteration to find the position of the transition of the observed data from the first circle to the second circle, it would instead be possible to specify the position of the transition using the location of an identified 'notch'. Thus, in this embodiment, outlying data points from a single circle fit would be used to identify a notch towards the start of the observed data, as described in the previous section. The outlying data points would then be taken to form the first circle in the double circle fit, and the remaining (non-outlying) data points would be taken to form the second circle in the double circle fit. This embodiment would advantageously reduce the computational burden of the iterative double circle fit. However, the iterative double circle fit has the advantage of greater accuracy.

Identifying the Appliance Based on the Observed Data and the Best Fit Data

Having identified the best fit, various parameters of the fit are retained for further analysis. Such parameters may include the circle radius/radii, the circle centre point(s), and the start point(s) of the circular arc(s), for example. The actual observed data points may also be retained for further analysis. This data is retained in order to enable a comparison with corresponding data in the database 29 of known electrical appliances which is stored in the memory 28 (see step S206). This comparison enables the electrical appliance in operation to be identified in step S207 if there is a match between the observed data and a set of corresponding data in the database 29 of known electrical appliances.

As one example, a method of matching to previously observed appliances could be to match based only on the parameters of the circle(s), i.e. the radius/radii and the centre(s). Such a system may work for example by calculating the Euclidean distance D between the observed parameters:

$$D = \sqrt{|x_o - x_a|^2 + |y_o - y_a|^2 + |r_o - r_a|^2}$$

where the centre of the circle with radius r has coordinates [x, y]. Subscript 'o' indicates that this is an observed parameter from the transient being analysed, and subscript 'a' indicates a parameter of an appliance/motor that has previously been identified and is stored in the memory 28 of the apparatus 20. It should be noted that the definition of D given above is for illustration only, and alternative definitions could be used. For example, it would be possible to normalise D so that it does not have a dependence on the circle radius, etc.

One could thus calculate the value of D for the observed motor with each previously identified motor and conclude that there is a match if D is less than a pre-determined threshold.

However, since the problem of fitting a circle to data points is ill-conditioned when we only have observed data for a small arc of the circle, small changes in the data can result in large changes in the observed parameters of the circle. This means that it is hard to match motors/appliances with a degree of certainty since the threshold of D that signifies a match is required to be high, leading to a potential overlap in feature space. Therefore, to avoid this problem, one advantageous embodiment of the present invention matches the motors/appliances using the 'Correlator' function, as described further below.

The 'Correlator' Function

Consider two sets of m data points denoted α and β which can both be fitted well to circles. The question is whether these data points are observations of the same underlying model (and hence the same motor-driven electrical appliance) or different models. For example, the data set a might be the observed data for the time period of interest where it has been ascertained (in step S205) that an electrical appliance comprising an induction motor was in operation in this time period. The data set β might be the corresponding data for a known induction-motor-type electrical appliance, as stored in the known appliance database 29 in the memory 28. In this case, the question is whether the observed data set α represents the same appliance as the stored data set β.

The set of data points for the data set α is denoted as $\{a\}_\alpha$ and the fitted parameters of the data set α (such as r* and $\underline{x}$*) are denoted as $\rho_\alpha$. Similar terminology is used for the data set β. The fitted parameters $\rho_\alpha$ of the data set α may include the circle/arc radius/radii, the arc length(s), and the arc locations(s). The arc length(s) may be defined in terms of the angle(s) subtended by arc(s), and/or the actual length(s) of the arc(s), and/or the straight line length(s) of arc(s). The arc location(s) may be defined in terms of the centre point(s) of the fitted circle(s), and/or the start point(s) of the arc(s). Other fitted parameters may be used as described further below. It has been noted that the first data point following a transient is reasonably invariant. Therefore, this could additionally be used as a parameter for matching.

A circle fit parameter f may be considered as a function of the input data $\{a\}$ and the parameters $\rho$, i.e. $f = f(\{a\}, \rho)$. The circle fit parameter f may be the function F that is minimised when using the Kåsa technique, or it may be the single circle fit parameter $f_1$ or the double circle fit parameter $f_2$, or it may be any other function related to how well the data fit to the circle(s). The Correlator function C between two data sets α and β is then defined as:

$$C(\alpha, \beta) = \frac{f(\{a\}_\beta, \rho_\alpha) f(\{a\}_\alpha, \rho_\beta)}{f(\{a\}_\beta, \rho_\beta) f(\{a\}_\alpha, \rho_\alpha)}$$

Thus, the Correlator function C measures the fits of each data set to the other data set's circle parameters, and then divides by the product of each data set's fit to its own circle.

Note that if α=β (i.e. the data sets are identical) then C=1 implying perfect correlation. The worse the correlation between the data sets, the greater the value of the Correlator function C. Note also that $C(\alpha, \beta) = C(\beta, \alpha)$ so that the Correlator function C exhibits the property of symmetry. Finally, note that the Correlator function C makes allowance for a poor initial fit in judging correlation. In effect, the Correlator function C considers the ratio of the fit of parameters to their own data, with the same parameters used on the comparison data. For symmetry it then multiplies by the other similar parameter ratio. Thus if the two comparison data sets both had a large degree of initial noise (measured as a deviation from a circle) then we judge it more likely that they could be correlated. This procedure could be open to the criticism that two sets of 'junk' data might be judged to be correlated. However, in the method of the present invention, the Correlator function is only used on data sets which have already been found to have a sufficiently low value of the single or double circle fit parameter $f_1$ or $f_2$. Thus, no 'junk' data sets are used in connection with the Correlator function C.

The value of the Correlator function C for two sets of data is used to assess whether there is a match between the two data sets. Again, it is necessary to assign a somewhat arbitrary threshold $C_{threshold}$ to decide whether two transients match, but as the Correlator function C has a much better condition number than the individual parameters, there is no overlap in feature space and thus choosing a threshold value $C_{threshold}$ is much more straightforward. If $C < C_{threshold}$ then the two datasets are considered to match, signifying that they relate to the same induction motor driven electrical appliance.

In one embodiment where the observed data points are fitted to a single circle only (e.g. using $f_1$), and 'notches' are not removed from the data sets, a value of $C_{threshold}=10000$ or $C_{threshold}=20000$, say, is found to be appropriate. In an alternative embodiment where the observed data points are fitted to a single circle only (again using $f_1$, for example), and any 'notches' are removed from the data sets, a value of $C_{threshold}=100$ is more appropriate. Thus, by incorporating notches into the model of the system, it is possible to increase the effectiveness of the Correlator function C. It should be noted that the values of $C_{threshold}$ given above are only exemplary and may be varied according to the desired application.

If a single-circle fit is used, and notches are identified as described above, then the notch information (i.e. the raw notch data and/or any derived notch parameters) can be used as further matching parameters since the notches provide a repeatable and invariant characteristic of the motor. In this case, match information from the notches is combined with match information from the Correlator function C defined above, and the results of these matches would be combined to define an enhanced match parameter. Numerous notch parameters could be used to compare matches. Examples of suitable notch parameters might include the position and amplitude of the maximum deviation from the fitted circle; the angular position of where the notch crosses the fitted circle; the angular range where the deviation of the notch from the fitted circle is greater than a threshold; and a correlation of the raw notch data points against each other.

When using the double-circle methodology to account for notch-like features (rather than the single-circle fitting methodology), it is advantageous to use only the parameters and data of the second circle when calculating the Correlator function C. This is because the second circle is larger and thus less ill-conditioned. A value of $C_{threshold}=10000$ or $C_{threshold}=20000$, say, is found to be appropriate in this case. Of course, it would alternatively be possible to calculate the Correlator function C based on the parameters and data of both the first and second circles.

For a given observed data set α, if it is found that $C \geq C_{threshold}$ for all data sets β stored in the database 29, then no matches are found and the observed appliance is assumed to be a new induction motor driven appliance that is not represented in the database 29. In one embodiment, the data for the new appliance could be added to the database 29 for comparison with future observed data.

Potential Applications of the Appliance Identification Technique

The first stage in using the apparatus 20 is the analysis stage as already described to identify which induction motor driven appliances are being used at any particular time and how much of the or each particular utility they are consuming. The second stage is to provide the user with short-term feedback via the user terminal 42. For example, if the user terminal is a dedicated device in a prominent place in the house, it could give immediate feedback, for example that a particular appliance was left on overnight when that is not usual. It could also highlight changes in the behaviour of appliances, for example if the energy consumption by a refrigerator or any other appliance showed an increase above an expected level, then the user terminal could suggest that the appliance needs servicing.

A further use of the apparatus 20 is to change the way billing is done, by acting as a 'smart meter'. The data from the apparatus 20 can be transmitted automatically to a central unit via radio frequency/mobile links which would eliminate the necessity for manual reading of a meter and would also eliminate estimation of meter readings. Billings and hence feedback can be carried out more frequently which also has a positive impact on reducing the quantity of energy being consumed.

A third stage in the use of the apparatus 20 is long-term feedback. For example, the user can perform trend analysis with the user terminal 42, particularly if it is a personal computer. The user can assess what behavioural changes have made the greatest impact on reduced consumption; the user can compare his energy usage profile with other users of similar sized properties, and communities of users can engage in interactive activities, such as exchanging tips on reducing usage and also in introducing a competitive element to achieve the greatest reductions.

According to a further embodiment of the invention, one or more of the appliances 12 connected to the supply wiring 14 can be a generator of electrical power, for example a solar photovoltaic panel or a wind turbine generator. As these devices generate power, which is either fed to other appliances 12, or even back to the supply utility 10, then the current and voltage detected by the sensor 16 would also change, and the processor 26 can perform exactly the same analysis based on appliance data stored in the memory 28 to determine when each device is generating power and the quantity generated. This gives convenient feedback about the precise savings achieved by using the solar panel or wind turbine, and also information about optimal siting of such devices.

In the embodiments of the invention described above, only electrical energy is measured and discussed. However, the apparatus could additionally/alternatively be concerned with other utilities, for example measuring water and/or gas consumption. In general, the apparatus may aggregate information about multiple utilities to improve confidence in the inferred usage of the utilities. For example, an appliance which relies on both water and electricity (e.g. a dishwasher or washing machine) may be more accurately identified based on both the electricity and water usage as a function of time.

Further Modifications to the Described Embodiments

Although preferred embodiments of the invention have been described, it is to be understood that these are by way of example only and that various modifications may be contemplated.

For example, the preferred embodiments described above identify electrical appliances by searching for 'circular' changes in the power consumption. The methodology is independent of the trigger condition that starts the search. In the majority of the embodiments described above, a large power delta has been used as a trigger condition for identifying a time period of interest because a transient follows the trigger. However, in addition to monitoring turn-on events, similar principles can also be used to identify continuous changes in power (e.g. caused by changes in the loading on a motor). Should an observed sequence of power values fit a circle, then the Correlator function C can again be used to match up the new observed points with an appliance in the existing database/library 29 of known electrical appliances regardless of whether or not the appliance has just been switched on.

In addition, the preferred embodiments described above parameterise the data points with one or more circles when trying to identify an electrical appliance comprising an induction motor. However, it is of course possible that other parameterisations could be chosen (i.e. shapes other than circles could be fitted to the observed data in order to identify an induction motor driven appliance). One method would be to fit the observed data to one or more ellipses (each ellipse requiring four parameters rather than two for a single circle), or the observed data could even be fitted to one or more straight lines (requiring two parameters per line). Alternative shapes are also envisaged within the scope of the invention.

It should be noted that one could parameterise the observed data with a custom function using as many observed data variables as desired. In other words, rather than having a pair of data values to represent each observed data point (e.g. a real power value and a reactive power value as described above), one could instead use n-tuples of data values to represent each observed data point. This would mean that there were n corresponding time series of different data values (e.g. for n=4, the data values might be a real power value, a reactive power value, a measure of water consumption and a measure of gas consumption). It would then be possible to fit the path of the data points through n-dimensional space to a predetermined n-dimensional function (e.g. a sphere, plane or saddle function for n=3).

Moreover, the preferred embodiments described above use real power and reactive power as the utility measurements of interest on which the subsequent circle-fitting and analysis is performed. However, it should be apparent that one could use a similar methodology with other derived electrical quantities (such as current, impedance, or the like). In addition, non-electrical utility measurements may also be used (e.g. water consumption, gas consumption, or the like). For example, it would be possible to identify a washing machine or dishwasher based on the path traced by the power consumption against the water consumption over a period of time. In these cases, it is likely that predetermined functions other than circles would be used to fit to the observed transients.

The invention claimed is:

1. A method of identifying the operation of an electrical appliance comprising an induction motor, the method comprising:
   electronically receiving, via a computing apparatus, data from a sensor coupled to the computing apparatus, the data including measurements of electrical consumption by a plurality of appliances;
   analyzing, via the computing apparatus, the data to characterize the electrical consumption by the plurality of appliances;
   providing feedback from the computing apparatus that an electrical appliance comprising an induction motor is in operation at a given time when a path traced by real power values against corresponding reactive power values over a time period of interest comprises one or more substantially circular arcs based on the analysis;
   wherein the real power values are related to the total real power supplied to the plurality of appliances as a function of time and the reactive power values are related to the total reactive power supplied to the plurality of appliances as a function of time.

2. The method of claim 1 wherein the real power values and the corresponding reactive power values are determined from measurements of the total current and the total voltage supplied to the plurality of appliances as a function of time.

3. The method of claim 1 further comprising a step of identifying the time period of interest wherein the step of identifying the time period of interest comprises:
   detecting a time at which an electrical appliance is switched on from an increase in the total power being supplied to the plurality of appliances as a function of time;
   detecting a time at which the electrical appliance reaches a steady state power consumption; and
   identifying the time period of interest as being a time period between the detected switch-on time and the detected steady-state time.

4. The method of claim 1 further comprising a step of identifying the time period of interest, wherein the step of identifying the time period of interest comprises identifying a time period during which the total power supplied to the plurality of appliances varies as a function of time.

5. The method of claim 1 comprising fitting the path traced by the real power values against the corresponding reactive power values to a single circle.

6. The method of claim 5 further comprising identifying the operation of an electrical appliance comprising an induction motor when at least one of an angular range of the real and reactive power values around the fitted single circle is greater than a predetermined threshold and the reactive power at the centre of the fitted single circle is greater than one or more of the reactive power values.

7. The method of claim 5 further comprising calculating a single-circle fit parameter representative of a goodness of the fit of the single circle to the path traced by the real power values against the corresponding reactive power values.

8. The method of claim 1 further comprising:
   identifying whether the path traced by the real power values against the corresponding reactive power values comprises two consecutive substantially circular arcs;
   partitioning the time period of interest into consecutive first and second time periods;
   fitting the path traced by the real power values against the corresponding reactive power values over the first time period to a first circle;
   fitting the path traced by the real power values against the corresponding reactive power values over the second time period to a second circle; and
   calculating a double-circle fit parameter representative of goodness of the combined fit of the first and second circles to the path traced by the real power values against the corresponding reactive power values.

9. The method of claim 8 further comprising:
   re-partitioning the time period into different consecutive first and second time periods;
   re-fitting the first and second circles in accordance with the re-partitioning;
   re-calculating the double-circle fit parameter in accordance with the re-partitioning; and
   selecting the best double-circle fit based on the calculated double-circle fit parameters.

10. The method of claim 8 wherein, before the partitioning step, the method further comprises:
    fitting the path traced by the real power values against the corresponding reactive power values to a single circle; and
    identifying one or more outlying data points in a first portion of the path traced by the real power values against the corresponding reactive power values;
    wherein the first time period in the partitioning step corresponds to said first portion of the path which includes the identified outlying data points.

11. The method of claim 1 wherein, having identified the operation of an electrical appliance comprising an induction motor, the method further comprises identifying the electrical appliance based at least partially on the real power values and the corresponding reactive power values.

12. The method of claim 11 wherein the step of identifying the electrical appliance comprises:
    determining one or more parameters of the one or more substantially circular arcs; and
    identifying the electrical appliance based at least partially on the one or more arc parameters;

wherein the one or more arc parameters include one or more of arc radius, arc length, and arc location.

13. The method of claim 12 wherein the step of identifying the electrical appliance comprises:
comparing the one or more arc parameters of the electrical appliance to corresponding arc parameters in a database of known electrical appliances; and
calculating the value of $$C(\alpha, \beta) = \frac{f(\{a\}_\beta, \rho_\alpha) f(\{a\}_\alpha, \rho_\beta)}{f(\{a\}_\beta, \rho_\beta) f(\{a\}_\alpha, \rho_\alpha)},$$

where $\{a\}_\alpha$ denotes the real power values and the corresponding reactive power values for the electrical appliance $\alpha$; $\rho_\alpha$ denotes the one or more arc parameters for the electrical appliance $\alpha$; $\{a\}_\beta$ denotes the real power values and the corresponding reactive power values for a known electrical appliance $\beta$ in the database of known electrical appliances; $\rho_\beta$ denotes the one or more arc parameters for the known electrical appliance $\beta$ in the database of known electrical appliances; and $f(\{a\}_p, \rho_q)$ is a function which provides an indication of a goodness of the fit between the real power values and corresponding reactive power values for an electrical appliance p and the one or more arc parameters for an electrical appliance q;
comparing the value of C to a predetermined threshold value.

14. The method of claim 1 wherein, having identified the operation of an electrical appliance comprising an induction motor, the method further comprises determining the load on the induction motor at a specified time by comparing the location of the real power value and the corresponding reactive power value on the circular arc at the specified time to the real power value and the corresponding reactive power value at the start location of the arc.

15. A method of identifying the operation of a specified type of appliance, the operation of said specified type of appliance being dependent on a supply of at least one utility including electricity, natural gas or water, the method comprising:
electronically receiving, via a computing apparatus, data from a sensor coupled to the computing apparatus, the data including measurements of electrical consumption by a plurality of appliances;
analyzing, via the computing apparatus, the data to characterize the electrical consumption by the plurality of appliances;
providing feedback from the computing apparatus that a specified type of appliance is in operation when a path traced by data points in an n-dimensional space substantially corresponds to a predetermined path type associated with that specified type of appliance based on the analysis;
wherein each dimension of the n-dimensional space represents a respective utility variable derived from the total supply of that utility to the plurality of appliances;
wherein the data points in the n-dimensional space represent values of the utility variables; and
wherein n>1.

16. The method of claim 15 further comprising:
fitting a function representative of the predetermined path type to the path traced by the data points;
calculating a fit parameter representative of a goodness of the fit of the function to the path traced by the data points; and
identifying the operation of the specified type of appliance by comparing the fit parameter to a predetermined threshold value.

17. The method of claim 15 wherein:
n=2;
the specified type of appliance is an electrical appliance comprising an induction motor;
the utility variable represented by the first dimension of the n-dimensional space is the total real power supplied to the plurality of appliances;
the utility variable represented by the second dimension of the n-dimensional space is the total reactive power supplied to the plurality of appliances; and
the predetermined path type comprises one or more substantially circular arcs.

18. An apparatus for identifying the operation of an electrical appliance comprising an induction motor, the apparatus comprising:
an input section arranged to receive data representative of the total supply of electrical power to a plurality of appliances as a function of time; and
a processing section arranged to identify the operation of an electrical appliance comprising an induction motor when a path traced by real power values against corresponding reactive power values over a time period of interest comprises one or more substantially circular arcs;
wherein the real power values are related to the total real power supplied to the plurality of appliances as a function of time and the reactive power values are related to the total reactive power supplied to the plurality of appliances as a function of time.

19. An apparatus for identifying the operation of a specified type of appliance, the operation of said specified type of appliance being dependent on a supply of at least one utility including electricity, natural gas or water, the apparatus comprising:
an input section arranged to receive data representative of the total supply of at least one utility to a plurality of appliances as a function of time;
an analysis section arranged to analyse the received data and to determine a time series of data points in an n-dimensional space, each dimension of the n-dimensional space representing a respective utility variable derived from the total supply of that utility to the plurality of appliances, the data points representing the received data, wherein n>1; and
a processing section arranged to identify the operation of a specified type of appliance when a path traced by the data points in the n-dimensional space substantially corresponds to a predetermined path type associated with that specified type of appliance.

* * * * *